(12) United States Patent
Warner et al.

(10) Patent No.: US 10,190,745 B2
(45) Date of Patent: Jan. 29, 2019

(54) LAMP ASSEMBLY FOR USE IN A HEADLAMP

(71) Applicant: Valeo North America, Inc., Seymour, IN (US)

(72) Inventors: Gavin Francis Warner, Columbus, IN (US); Julien Hemon, Columbus, IN (US); Frederick Allen Roth, Seymour, IN (US); Jonathan Michael Blandin, Columbus, IN (US); Keith Edward Chesser, Edinburgh, IN (US)

(73) Assignee: Valeo North America, Inc., Seymour, IN (US)

( * ) Notice: Subject to any disclaimer, the term of this patent is extended or adjusted under 35 U.S.C. 154(b) by 0 days.

(21) Appl. No.: 15/498,839

(22) Filed: Apr. 27, 2017

(65) Prior Publication Data

US 2018/0313516 A1    Nov. 1, 2018

(51) Int. Cl.
| | |
|---|---|
| *F21S 41/19* | (2018.01) |
| *F21S 45/47* | (2018.01) |
| *H05K 1/02* | (2006.01) |
| *B60Q 1/04* | (2006.01) |
| *F21S 41/24* | (2018.01) |
| *F21S 41/141* | (2018.01) |
| *F21Y 115/10* | (2016.01) |

(52) U.S. Cl.
CPC ............... *F21S 45/47* (2018.01); *B60Q 1/04* (2013.01); *F21S 41/141* (2018.01); *F21S 41/192* (2018.01); *F21S 41/24* (2018.01); *H05K 1/0203* (2013.01); *B60Q 2400/30* (2013.01); *F21Y 2115/10* (2016.08); *H05K 2201/10106* (2013.01)

(58) Field of Classification Search
CPC .... F21S 48/328; F21S 48/1109; F21S 48/115; F21S 48/1241; H05K 1/0203; H05K 2201/10106; B60Q 1/04; B60Q 2400/30; F21Y 2115/10
See application file for complete search history.

(56) References Cited

U.S. PATENT DOCUMENTS

| | | | |
|---|---|---|---|
| 2012/0281432 A1* | 11/2012 | Parker | F21V 29/70 362/609 |
| 2013/0051005 A1* | 2/2013 | Markell | F21V 29/004 362/234 |
| 2015/0377448 A1 | 12/2015 | Willeke | |
| 2016/0201870 A1* | 7/2016 | Ruckebusch | F21S 48/325 362/547 |
| 2016/0281954 A1* | 9/2016 | Moisy | B60Q 1/0408 |

FOREIGN PATENT DOCUMENTS

EP        2378323 A2    10/2011

* cited by examiner

*Primary Examiner* — Donald L Raleigh
(74) *Attorney, Agent, or Firm* — Oblon, McClelland, Maier & Neustadt, L.L.P.

(57) ABSTRACT

A lamp assembly for mounting in a headlamp comprising a heat sink having a printed circuit board landing area for receiving a printed circuit board and a light source landing area for receiving at least one light source. The lamp assembly also comprises a light guide and a bracket for detachably mounting on the heat sink. The bracket is adapted to engage and secure the light guide in a predetermined position on the heat sink, the at least one light source and the printed circuit board a unsealed in the heat sink.

16 Claims, 7 Drawing Sheets

LAMP ASSEMBLY FOR USE IN A HEADLAMP

BACKGROUND OF THE INVENTION

1. Field of the Invention

This invention relates to motor vehicle headlamps and, more particularly, to a lamp assembly that is situated in a headlamp.

2. Description of the Related Art

In the field of automotive lighting, LEDs may be used in combination with a light pipe to provide a vehicle lighting function. In the past, the LEDs were mounted directly to a printed circuit board (PCB) which in turn was mounted to a heat sink that was required to dissipate heat generated by the printed circuit board and the LEDs which were mounted thereon. The light pipe was typically situated such that its input face was positioned in operative relationship with the LEDs.

The heat sink was then mounted outside the headlamp to a housing on the vehicle. This required that the heat sink be sealed or to be sealed to the housing. Therefore, a seal had to be provided to seal the heat sink and the components mounted thereon, including the printed circuit board and the LEDs. Because the LEDs were mounted directly to the printed circuit board, which in turn was mounted to the heat sink, a relatively large heat sink was necessary to dissipate the heat from both of these components.

It was not uncommon that the designs of the prior art required that the heat sink be mounted to the housing and then at some point later, the light pipe would be loaded. The loading of the light pipe into the heat sink was oftentimes blind and susceptible to mislocations or misregistrations such of the entry face of the light pipe relative to the LEDs.

What is needed, therefore, is a system, assembly and method that overcomes one or more of the aforementioned problems or other problems in the prior art.

SUMMARY OF THE INVENTION

It is, therefore, a primary object of the invention to provide a lamp assembly that eliminates the need for a heat sink seal.

Another object of the invention is to provide an assembly wherein at least one or a plurality of LEDs can be sub-mounted on the heat sink separate from a printed circuit board, thereby enabling a size of the heat sink to be reduced.

Yet another object of the invention is to provide a lamp assembly wherein a light pipe can be mounted to the heat sink before the assembly is loaded into a lamp.

Still another object of the invention is to improve the heat transmission efficiency and heat dissipation of the printed circuit board and the at least one or a plurality of LEDs.

Still another object of the invention is to provide a lamp assembly that can be situated directly in the headlamp, thereby eliminating the need for a seal.

Another object of the invention is to provide a processed, folded or stamped heat sink that has at least one or a plurality of protectors for protecting the components that are mounted on the heat sink.

Yet another object of the invention is to provide a system and assembly that facilitates reducing the cost of a lamp assembly.

Another object of the invention is to provide a system and assembly that is modular and is adapted to precisely load components, such as a circuit board, LED and/or light pipe, onto a heat sink so that the components are registered in a predetermined position thereon.

In one aspect, one embodiment of the invention comprises a lamp assembly for mounting in a headlamp comprising a heat sink, the heat sink having a printed circuit board landing area for receiving a printed circuit board and a light source landing area for receiving at least one light source, a light guide, and a bracket for detachably mounting on the heat sink, the bracket being adapted to engage and secure the light guide in a predetermined position on the heat sink.

In another aspect, another embodiment of the invention comprises a headlamp comprising a headlamp housing, a primary light source for performing a primary lighting function, a lamp assembly for performing a secondary lighting function, the lamp assembly being mounted in the headlamp housing, and a lens and a seal for mounting on the headlamp housing, the lamp assembly comprising a heat sink, the heat sink having a printed circuit board landing area for receiving a printed circuit board and a light source landing area for receiving at least one light source, a light guide, and a bracket for detachably mounting on the heat sink, the bracket being adapted to engage and secure the light guide in a predetermined position.

This invention, including all embodiments shown and described herein, could be used alone or together and/or in combination with one or more of the features covered by one or more of the following list of features:

The lamp assembly wherein the at least one light source comprises at least one LED that is mounted directly to the light source landing area.

The lamp assembly wherein the light guide comprises a projection, the heat sink comprising at least one aperture adapted to receive the projection and cause an input face of the light guide to be situated in opposed relationship to the at least one light source.

The lamp assembly wherein the heat sink comprises at least one wall.

The lamp assembly wherein the heat sink is an integral or monolithic construction and is processed or folded to comprise a plurality of walls for protecting the printed circuit board, the at least one light source and an electrical connection therebetween.

The lamp assembly wherein the plurality of walls comprises a first wall having at least one first wall aperture and a generally opposing second wall having at least one second wall aperture, the bracket comprising at least one first resilient arm and at least one second resilient arm each having a detent, the detent of the at least one first resilient arm being adapted to be received in the at least one first wall aperture and the detent of the at least one second resilient arm being adapted to be received in the at least one second wall aperture in order to secure or lock the bracket onto the heat sink.

The lamp assembly wherein heat sink comprises at least one registration post, the printed circuit board comprising an aperture having a dimension and shape that generally complements a dimension and shape of the at least one registration post so that when the printed circuit board is mounted on the heat sink, the printed circuit board becomes automatically registered relative to the at least one light source on the light source landing area.

The lamp assembly wherein the lamp assembly is mounted in a sealed headlamp.

The lamp assembly wherein the lamp assembly performs at least one of a primary lighting function or a secondary lighting function.

The lamp assembly wherein the secondary lighting function is a daytime running light function.

The lamp assembly wherein at least two LEDs cooperate with the light guide, one for daytime running lights (DRL) and one for a turn indicator.

The lamp assembly wherein the LED for daytime running lights can be dimmed in order to obtain a parking light or a position light.

The headlamp wherein the at least one light source comprises at least one LED that is mounted directly to the light source landing area.

The headlamp wherein the light guide comprises a projection, the heat sink comprising at least one aperture adapted to receive the projection and cause an input face of the light guide to be situated in opposed relationship to the at least one light source.

The headlamp wherein the heat sink comprises at least one wall for protecting the printed circuit board, the at least one light source and an electrical connection therebetween.

The headlamp wherein the heat sink is an integral or monolithic construction and is processed or folded to comprise a plurality of walls for protecting the printed circuit board, the at least one light source and an electrical connection therebetween.

The headlamp wherein the plurality of walls comprises a first wall having at least one first wall aperture and a generally opposing second wall having at least one second wall aperture, the bracket comprising at least one first resilient arm and at least one second resilient arm each having a detent, the detent of the at least one first resilient arm being adapted to be received in the at least one first wall aperture and the detent of the at least one second resilient arm being adapted to be received in the at least one second wall aperture in order to secure or lock the bracket onto the heat sink.

The headlamp wherein the heat sink comprises at least one registration post, the printed circuit board comprising an aperture having a dimension and shape that generally complements a dimension and shape of the at least one registration post so that when the printed circuit board is mounted on the heat sink, the printed circuit board becomes automatically registered relative to the at least one light source on the light source landing area.

The headlamp wherein the primary lighting function is a low beam or high beam headlamp function and the secondary lighting function is a daytime running light function.

The headlamp wherein the lamp assembly performs a secondary lighting function.

The lamp assembly wherein said at least one light source and the printed circuit board are unsealed relative to the environment and become sealed relative to the environment after the lamp assembly is mounted in the headlamp These and other objects and advantages of the invention will be apparent from the following description, the accompanying drawings and the appended claims.

DETAILED DESCRIPTION OF THE PREFERRED EMBODIMENTS

Figure 1:
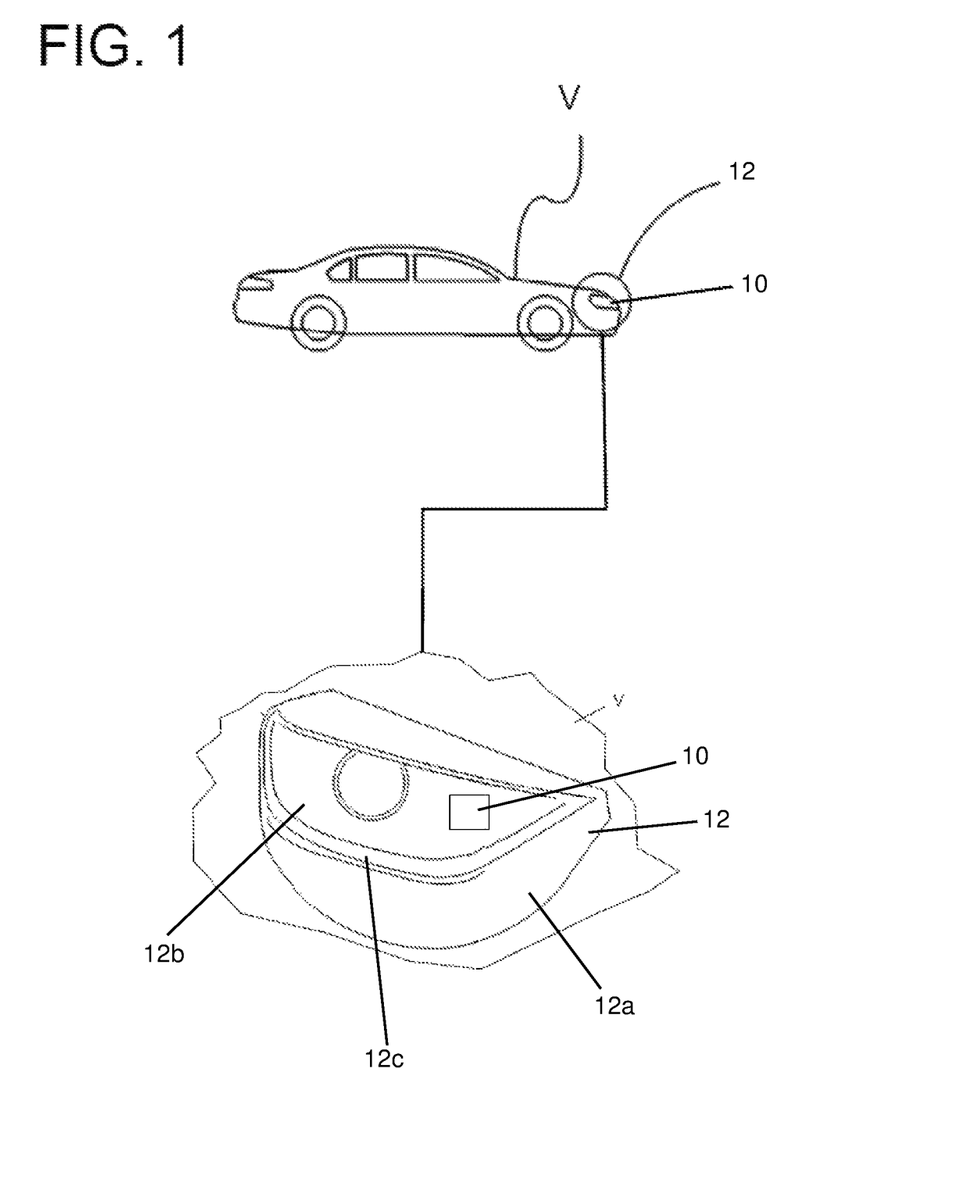
FIG. 1 is a view of a lamp assembly in accordance with one embodiment situated inside a headlamp.
Figure 2:
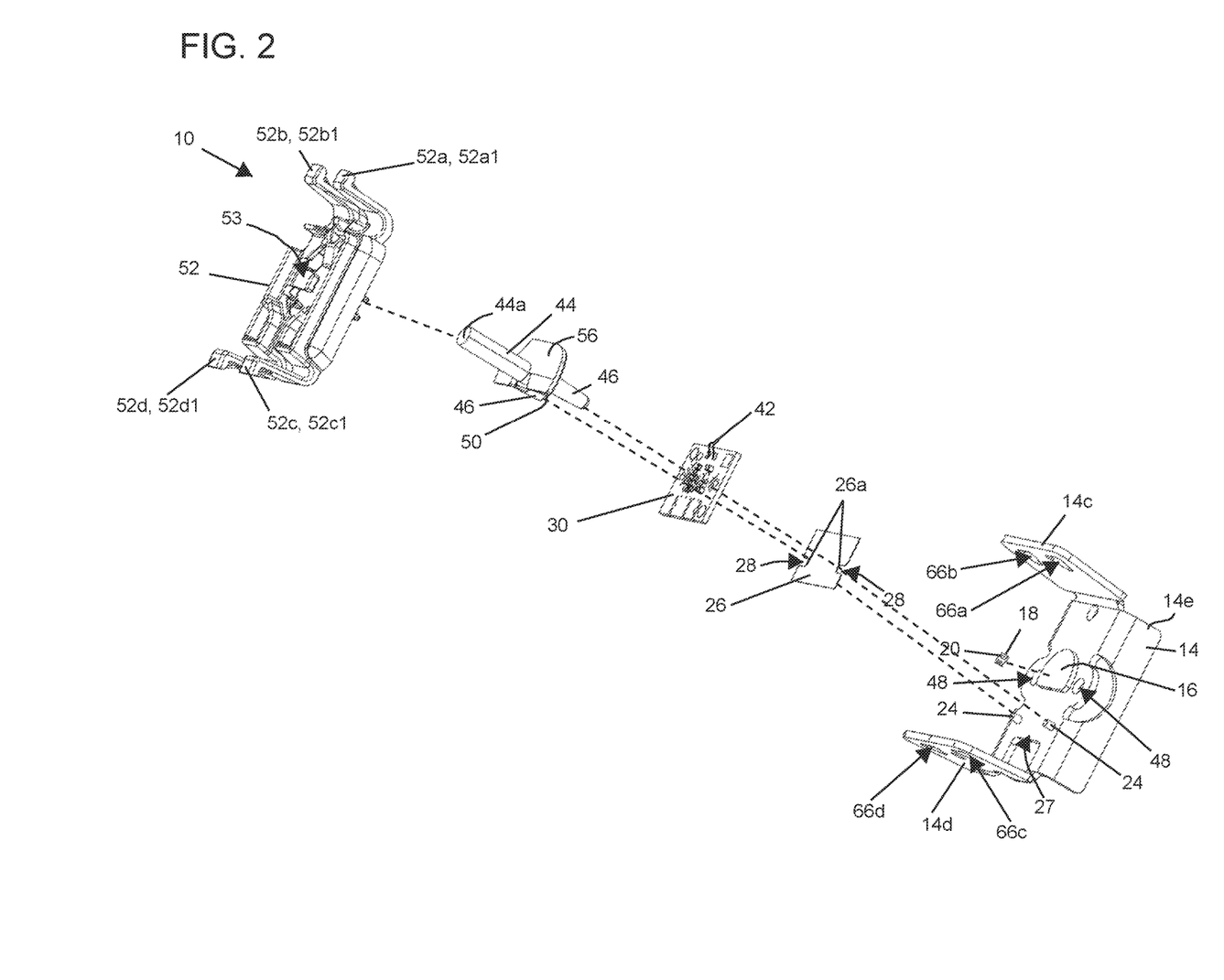
FIG. 2 is an exploded view of the lamp assembly shown in FIG. 1
Figure 3:
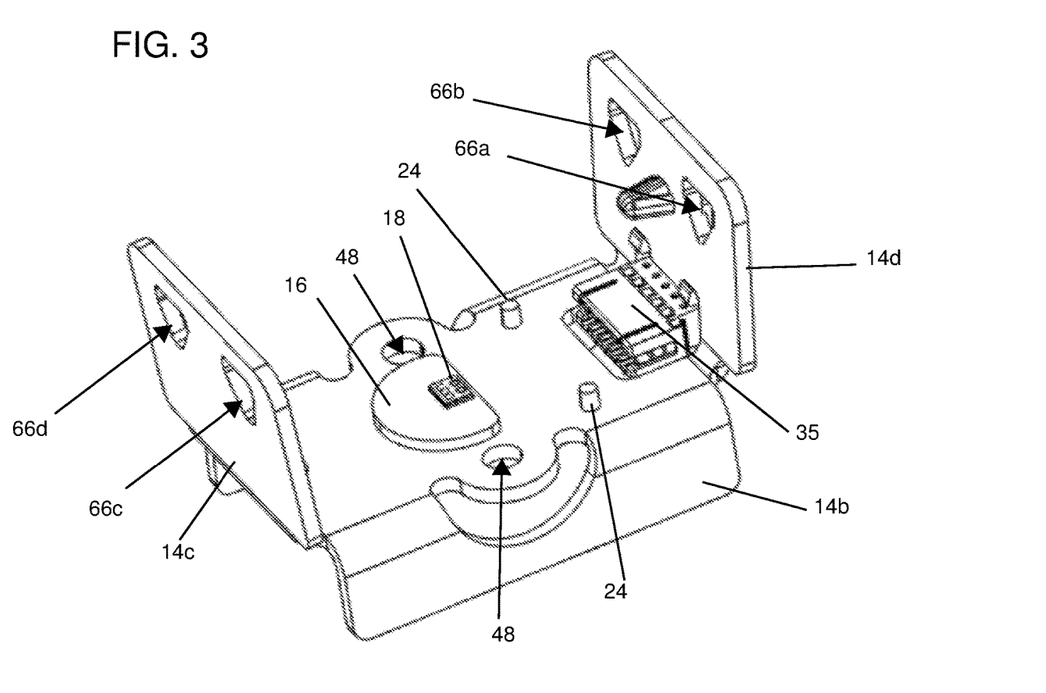
FIG. 3 is a perspective view of a heat sink showing at least one or a plurality of LEDs mounted on an LED landing area.

Referring now to FIG. 1, a lamp assembly 10 is shown mounted in a headlamp assembly 12 of a vehicle V. The headlamp assembly 12 comprises a bezel or housing 12a, a lens 12b and a seal 12c that generally seals the lamp assembly 10 in the headlamp assembly 12. The lamp assembly 10 comprises a heat sink 14 which is stamped from a single piece of material (not shown) and configured as illustrated in the exploded view of FIG. 2. The heat sink 14 is a one-piece integral or monolithic construction and is processed or folded to comprise a first wall 14a, a second wall 14b (FIG. 3) that generally opposes the first wall 14a, a first end wall 14c and a second end wall 14d that generally opposes the first end wall 14c as illustrated in FIG. 2. Note that the heat sink 14 comprises a crescent or half-moon shaped landing pad or area 16 that is adapted to receive a light source 18 which may comprise at least one or a plurality of light-emitting diodes (LEDs) 20. In the illustration being described, the at least one LED 20 is mounted on the landing pad or area 16 using a conventional adhesive. It should be understood that the heat sink 14 may be coated or treated, such as by anodizing the heat sink 14, to facilitate heat transfer from the light source 18 to the heat sink 14. However, it is preferable that the landing pad or area 16 not have any coating in order to improve the adhesion of the at least one LED 20 to the landing pad or area 16. In one embodiment, after the heat sink 14 is anodized, the landing pad or area 16 is laser ablated to facilitate adhering the at last one LED 20 thereto.

The heat sink 14 comprises a plurality of registration posts 24. A thermal compound 26 comprises a plurality of walls 26a that define a plurality of apertures 28 that receive the posts 24 and register the thermal compound 26 on a printed circuit board landing area 27 (FIG. 2) on the heat sink 14 and in operative relationship with the landing pad or area 16. It should be understood that the thermal compound 26 adheres the printed circuit board 30 to the heat sink 14 and also provides a thermal conductivity between the printed circuit board 30 and heat sink 14. A printed circuit board (PCB) 30 is mounted to the printed circuit board landing area 27 with the thermal compound 26. The printed circuit board 30 controls the operation of the light source 18 and at least one LED 20. The printed circuit board 30 is mounted on the thermal compound 26 as shown. In this regard and as best illustrated in FIGS. 2 and 5, note that the printed circuit board 30 comprises a plurality of apertures 32 that receive the registration posts 24 which causes an automatic registration of the printed circuit board 30 relative to the landing pad or area 16.

Figure 4:
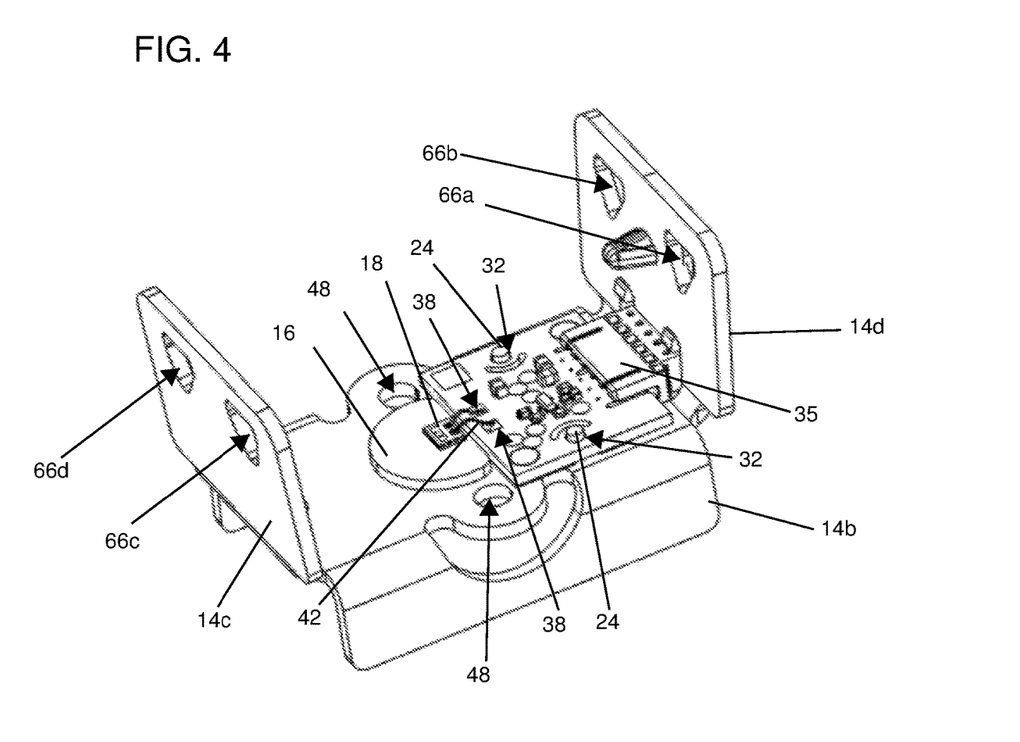
FIG. 4 is a perspective view similar to FIG. 3 showing a circuit board mounted in proximity to the at least one or a plurality of LEDs.
Figure 8:
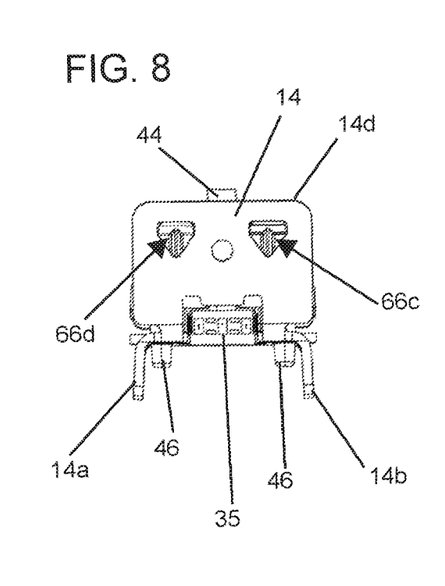
FIG. 8 is a right side view of the lamp assembly.
Figure 9:
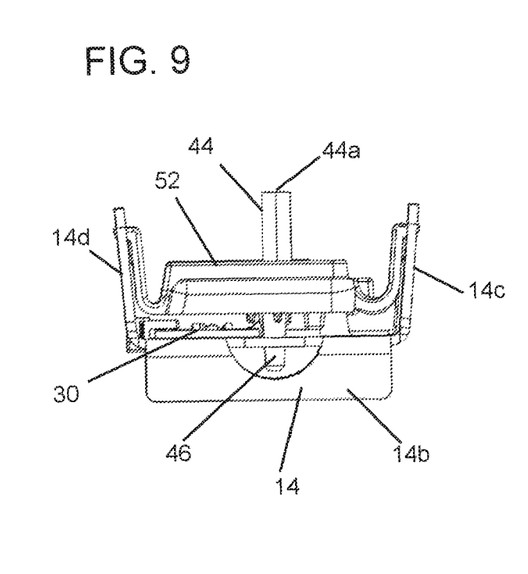
FIG. 9 is a side view of the lamp assembly.
Figure 10:
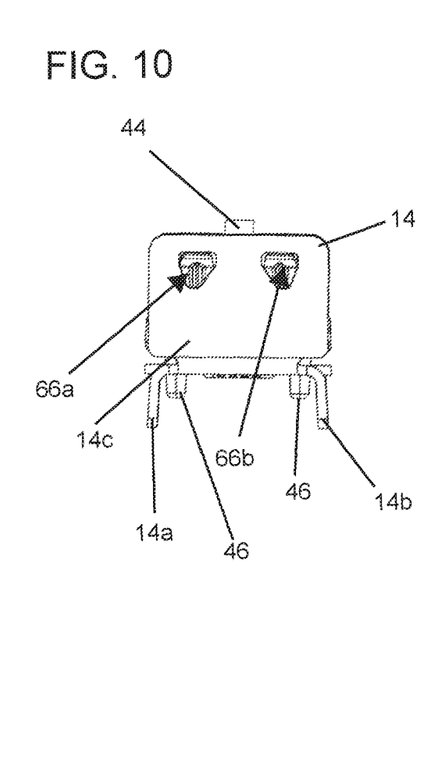
FIG. 10 is a left side view of the lamp assembly.

As best illustrated in FIG. 4, the printed circuit board 30 comprises a female connector 35 (FIGS. 4 and 8) coupling to a power source (not shown) of the vehicle V. The printed circuit board 30 also comprises a plurality of vias or conductors 38 for coupling to the light source 18. A plurality of electrical conductors 42 electrically couple the printed circuit board 30 to the light source 18.

Returning to FIG. 2, note that the lamp assembly 10 comprises a light pipe 44 having a plurality of projections 46 that are received in apertures 48 in the heat sink 14. In the illustration being described, the projections 46 of the light pipe 44 are frusto-conically shaped in cross-section so that they are easily received in the apertures 48, and when press-fit, an input face 50 of the light pipe 44 becomes automatically registered a predetermined distance relative to the light source 18.

Figure 5:
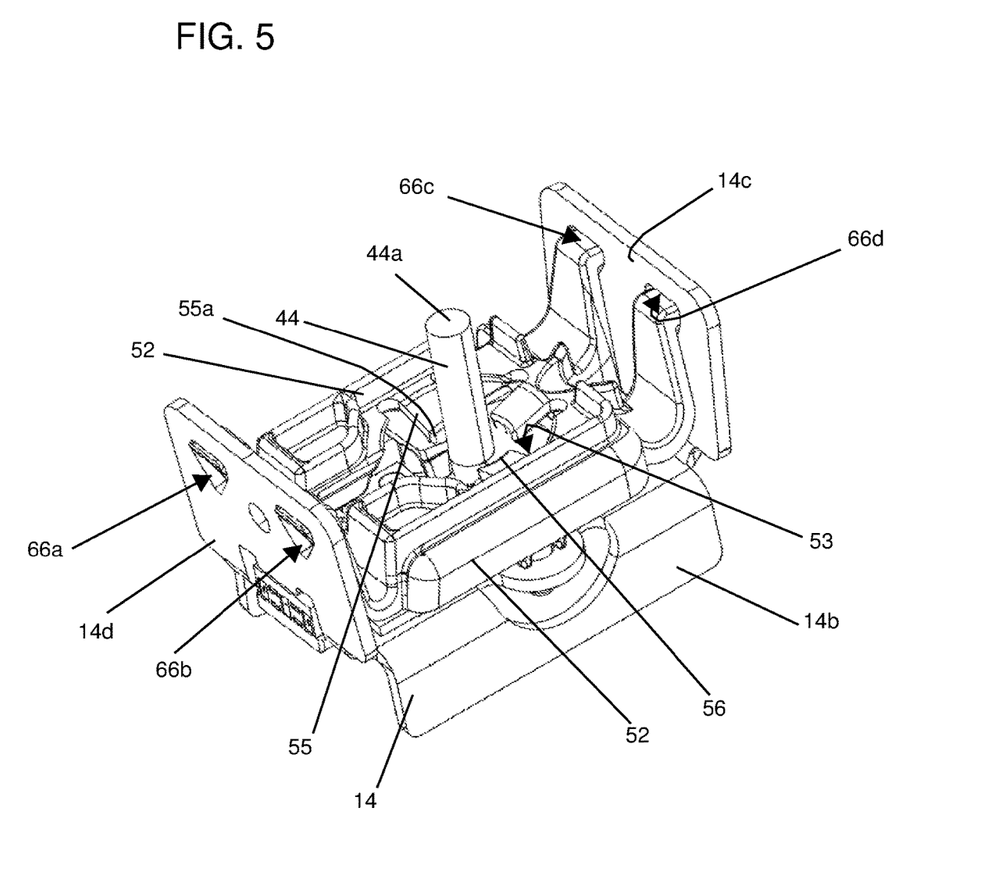
FIG. 5 is a perspective view of the lamp assembly in assembled form.
Figure 6:
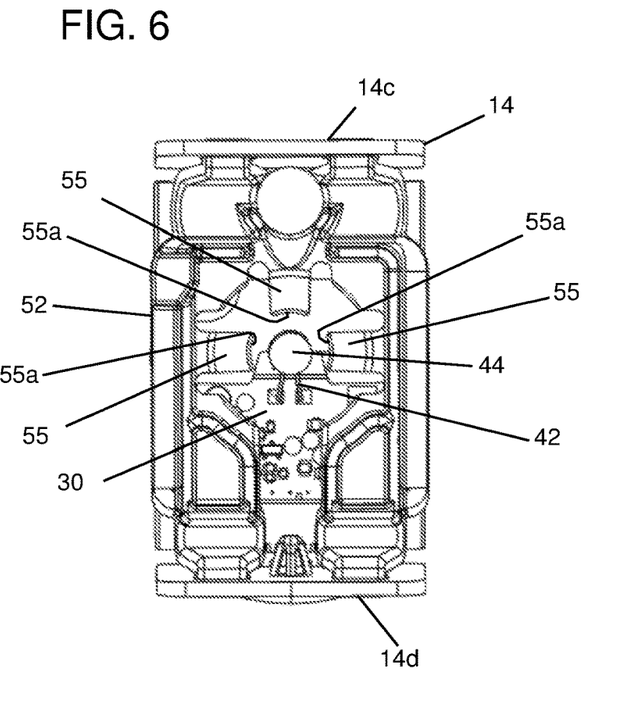
FIG. 6 is a plan view of the lamp assembly in assembled form.
Figure 7:
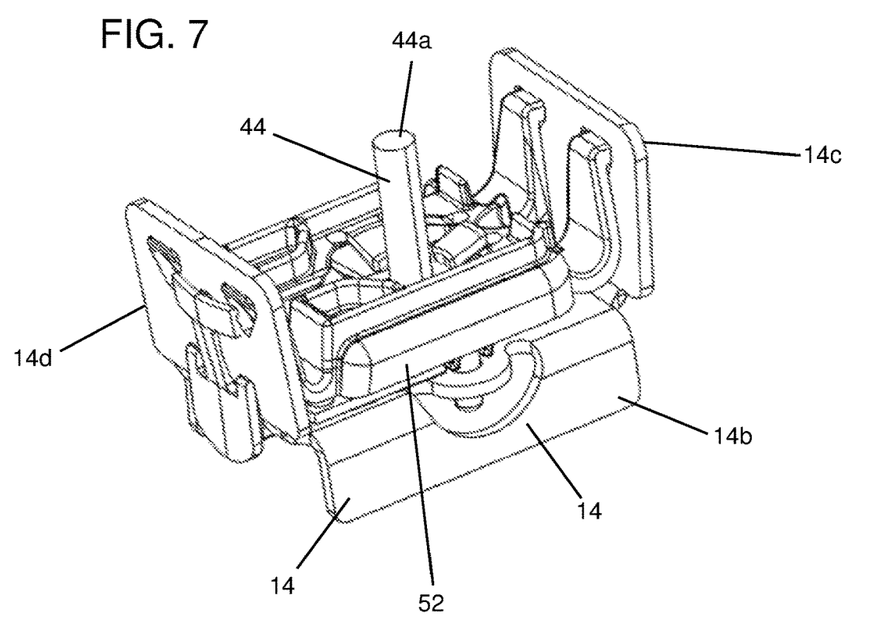
FIG. 7 is another perspective view of the lamp assembly in assembled form and showing a female connector protector.

As illustrated in FIGS. 2 and 5, a bracket 52 is mounted on the heat sink 14 and engages a surface or shoulder 56 of the light pipe 44 in order to retain it in a locked or secured position in the lamp assembly 10. During assembly, the exit face 44a (FIGS. 2, 5, 7 and 9) of the light pipe 44 is guided through an aperture 53 of the bracket 52. The bracket 52 comprises a plurality of resilient arms 55 having ends, such as end 55a (FIG. 6), that engage the shoulder 56 (FIG. 2) and hold it in a locked position on the heat sink 14.

The bracket 52 also has resilient locking arms 52a-52d having ends or detents 52a1-52d1, respectively, that are received in apertures 66a, 66b 66c and 66d (FIGS. 2-5, 8 and 10) in the heat sink 14 as illustrated in FIG. 2. The resilient arms 52a-52d force the ends or detents 52a1-52d1, respectively, into the apertures 66a-66d, thereby locking the bracket 52 onto the heat sink 14.

After assembly of the lamp assembly 10, the lamp assembly 10 is mounted in the headlamp assembly 12, which is sealed from weather and debris. Advantageously, because the light source 18 is mounted directly to the heat sink 14, rather than the printed circuit board 30 as was done in the prior art, a smaller heat sink 14 can be used. By reducing the overall size of the heat sink 14, the lamp assembly 10 is adaptable for mounting inside the headlamp assembly 12 as opposed to mounting on a housing (not shown) on which the headlamp assembly 12 is mounted. By doing so, the inventors have eliminated the need for a sealed heat sink as was done in the prior art. Note that the printed circuit board 30 and at least one light source 20 are not sealed on the heat sink 14, which is contrary to the prior art.

Another advantageous feature of the folded or processed heat sink 14 is that the heat sink 14 is adapted to comprise the walls 14c and 14d which protect the printed circuit board 30 and light source 18 and the electrical conductors 42. In the illustration being described, the light source 18 and the at least one or plurality of LEDs 20 comprise at least one LED, such as a high powered LED, an organic light-emitting diodes, laser diodes, filaments, arcs, or the like. It should be understood that the LED may emit a white light, a yellow light for DRL/parking lights or an amber light for a turn signal indicator.

ADDITIONAL CONSIDERATIONS

Advantageously, the lamp assembly 10 is especially adapted to be used in a daytime running lamp (DRL) environment.

The lamp assembly can have at least two LEDs that cooperate with the light guide, one for daytime running lights (DRL) and one for a turn indicator. Also, the LED for daytime running lights can be dimmed in order to obtain a parking light or a position light As mentioned earlier, except for the landing pad or area 16, the heat sink 14 is coated or treated, such as by anodization, for example, with a dark or black coating which facilitates heat transfer and dissipation. The landing pad or area 16 is not coated or the coating is removed (for example, by laser ablation) to enhance adhesion between the light source 18 and the heat sink 14.

By separating the mounting of the light source 18 from the printed circuit board 30 and providing the other features described herein, the lamp assembly 10 is dimensioned and sized to be mounted directly inside the headlamp assembly 12 which itself is sealed so that the lamp assembly 10 eliminates the need for a heat sink housing, cap, seals and the like of the type used in the prior art.

This invention, including all embodiments shown and described herein, could be used alone or together and/or in combination with one or more of the features covered by one or more of the claims set forth herein, including but not limited to one or more of the features or steps mentioned in the Summary of the Invention and the claims.

While the system, apparatus and method herein described constitute preferred embodiments of this invention, it is to be understood that the invention is not limited to this precise system, apparatus and method, and that changes may be made therein without departing from the scope of the invention which is defined in the appended claims.

What is claimed is:

1. A lamp assembly for mounting in a headlamp comprising:
   a heat sink, said heat sink having a printed circuit board landing area for receiving a printed circuit board and a light source landing area for receiving at least one light source;
   a light guide; and
   a bracket for detachably mounting on said heat sink, said bracket being adapted to engage and secure said light guide in a predetermined position on said heat sink,
   wherein said heat sink is an integral or monolithic construction and is processed or folded to comprise a plurality of walls for protecting said printed circuit board, said at least one light source and an electrical connection therebetween, and
   wherein said plurality of walls comprises a first wall having at least one first wall aperture and a generally opposing second wall having at least one second wall aperture, said bracket comprising at least one first resilient arm and at least one second resilient arm each having a detent, said detent of said at least one first resilient arm being adapted to be received in said at least one first wall aperture and said detent of said at least one second resilient arm being adapted to be received in said at least one second wall aperture in order to secure or lock said bracket onto said heat sink.

2. The lamp assembly as recited in claim 1 wherein said at least one light source comprises at least one LED that is mounted directly to said light source landing area.

3. The lamp assembly as recited in claim 1 wherein said light guide comprises a projection, said heat sink comprising at least one aperture adapted to receive said projection and cause an input face of said light guide to be situated in opposed relationship to said at least one light source.

4. The lamp assembly as recited in claim 1 wherein said heat sink comprises at least one wall.

5. The lamp assembly as recited in claim 1 wherein heat sink comprises at least one registration post, said printed circuit board comprising an aperture having a dimension and shape that generally complements a dimension and shape of said at least one registration post so that when said printed circuit board is mounted on said heat sink, said printed circuit board becomes automatically registered relative to said at least one light source on said light source landing area.

6. The lamp assembly as recited in claim 1 wherein said lamp assembly is mounted in a sealed headlamp.

7. The lamp assembly as recited in claim 1 wherein said lamp assembly performs at least one of a primary lighting function or a secondary lighting function.

8. The lamp assembly as recited in claim 6 wherein said lamp assembly performs at least one of a primary lighting function or a secondary lighting function.

9. The lamp assembly as recited in claim 7 wherein said secondary lighting function is a daytime running light function.

10. A headlamp comprising:
a headlamp housing;
a primary light source for performing a primary lighting function;
a lamp assembly for performing a secondary lighting function, said lamp assembly being mounted in said headlamp housing; and
a lens and a seal for mounting on said headlamp housing;
said lamp assembly comprising:
a heat sink, said heat sink having a printed circuit board landing area for receiving a printed circuit board and a light source landing area for receiving at least one light source;
a light guide; and
a bracket for detachably mounting on said heat sink, said bracket being adapted to engage and secure said light guide in a predetermined position,
wherein said heat sink is an integral or monolithic construction and is processed or folded to comprise a plurality of walls for protecting said printed circuit board, said at least one light source and an electrical connection therebetween, and
wherein said plurality of walls comprises a first wall having at least one first wall aperture and a generally opposing second wall having at least one second wall aperture, said bracket comprising at least one first resilient arm and at least one second resilient arm each having a detent, said detent of said at least one first resilient arm being adapted to be received in said at least one first wall aperture and said detent of said at least one second resilient arm being adapted to be received in said at least one second wall aperture in order to secure or lock said bracket onto said heat sink.

11. The headlamp as recited in claim 10 wherein said at least one light source comprises at least one LED that is mounted directly to said light source landing area.

12. The headlamp as recited in claim 10 wherein said light guide comprises a projection, said heat sink comprising at least one aperture adapted to receive said projection and cause an input face of said light guide to be situated in opposed relationship to said at least one light source.

13. The headlamp as recited in claim 10 wherein said heat sink comprises at least one wall for protecting said printed circuit board, said at least one light source and an electrical connection therebetween.

14. The headlamp as recited in claim 10 wherein said heat sink comprises at least one registration post, said printed circuit board comprising an aperture having a dimension and shape that generally complements a dimension and shape of said at least one registration post so that when said printed circuit board is mounted on said heat sink, said printed circuit board becomes automatically registered relative to said at least one light source on said light source landing area.

15. The headlamp as recited in claim 10 wherein said primary lighting function is a low beam or high beam headlamp function and said secondary lighting function is a daytime running light function.

16. The lamp assembly as recited in claim 1 wherein said at least one light source and said printed circuit board are unsealed relative to the environment and become sealed relative to the environment after the lamp assembly is mounted in the headlamp.

\* \* \* \* \*